(12) United States Patent
Miller

(10) Patent No.: US 11,203,809 B2
(45) Date of Patent: Dec. 21, 2021

(54) PARTIAL SPRAY REFURBISHMENT OF SPUTTERING TARGETS

(71) Applicant: Steven A. Miller, Canton, MA (US)

(72) Inventor: Steven A. Miller, Canton, MA (US)

(73) Assignee: H.C. STARCK INC., Newton, MA (US)

( * ) Notice: Subject to any disclaimer, the term of this patent is extended or adjusted under 35 U.S.C. 154(b) by 92 days.

(21) Appl. No.: 16/591,718

(22) Filed: Oct. 3, 2019

(65) Prior Publication Data

US 2020/0102643 A1 Apr. 2, 2020

Related U.S. Application Data

(63) Continuation of application No. 15/960,844, filed on Apr. 24, 2018, now Pat. No. 10,472,712, which is a continuation of application No. 14/908,396, filed as application No. PCT/US2014/049073 on Jul. 31, 2014, now Pat. No. 9,976,212.

(60) Provisional application No. 61/861,177, filed on Aug. 1, 2013.

(51) Int. Cl.
*C23C 14/34* (2006.01)
*C23C 24/04* (2006.01)
*H01J 37/34* (2006.01)

(52) U.S. Cl.
CPC .......... *C23C 14/3414* (2013.01); *C23C 24/04* (2013.01); *H01J 37/3417* (2013.01); *H01J 37/3426* (2013.01); *H01J 2237/081* (2013.01); *H01J 2237/332* (2013.01)

(58) Field of Classification Search
None
See application file for complete search history.

(56) References Cited

U.S. PATENT DOCUMENTS

| 7,910,051 | B2 | 3/2011 | Zimmermann et al. |
| 8,197,894 | B2 | 6/2012 | Miller et al. |
| 8,703,233 | B2 | 4/2014 | Miller et al. |
| 8,802,191 | B2 | 8/2014 | Zimmermann et al. |
| 9,976,212 | B2 | 5/2018 | Miller |
| 2006/0021870 | A1* | 2/2006 | Tsai ..................... C23C 14/3414 204/192.13 |
| 2010/0015467 | A1 | 1/2010 | Zimmermann et al. |
| 2011/0290643 | A1* | 12/2011 | Munteanu ............. C04B 35/653 204/298.13 |
| 2012/0199469 | A1 | 8/2012 | Rasheed et al. |
| 2013/0156967 | A1* | 6/2013 | Michaluk ............ C23C 14/3414 427/446 |
| 2016/0160341 | A1 | 6/2016 | Miller |
| 2018/0305806 | A1 | 10/2018 | Miller |

* cited by examiner

Primary Examiner — Michael P. Rodriguez
(74) Attorney, Agent, or Firm — Morgan, Lewis & Bockius LLP

(57) ABSTRACT

In various embodiments, eroded sputtering targets are partially refurbished by spray-depositing particles of target material to at least partially fill certain regions (e.g., regions of deepest erosion) without spray-deposition within other eroded regions (e.g., regions of less erosion). The partially refurbished sputtering targets may be sputtered after the partial refurbishment without substantive changes in sputtering properties (e.g., sputtering rate) and/or properties of the sputtered films.

19 Claims, 5 Drawing Sheets

PARTIAL SPRAY REFURBISHMENT OF SPUTTERING TARGETS

RELATED APPLICATIONS

This application is a continuation of U.S. Ser. No. 15/960,844, filed on Apr. 24, 2018, which is a continuation of U.S. Ser. No. 14/908,396, filed on Jan. 28, 2016, which is the U.S. national stage application of International (PCT) Patent Application Serial No. PCT/US2014/049073, filed Jul. 31, 2014, which claims the benefit of and priority to U.S. Provisional Patent Application No. 61/861,177, filed Aug. 1, 2013, the entire disclosure of each of which is hereby incorporated herein by reference.

TECHNICAL FIELD

In various embodiments, the present invention relates to spray deposition of metallic and/or non-metallic powders, in particular spray deposition for partial refurbishment of sputtering targets.

BACKGROUND

Sputtering, a physical-vapor-deposition technique, is utilized in many industries to deposit thin films of various materials with highly controllable composition and uniformity on any of a variety of substrates. In a sputtering process, a sputtering target of the material to be deposited (or a component thereof) is subjected to bombardment by energetic particles (e.g., plasma particles), which thus eject atoms of the target material toward the substrate, on which they are deposited. Conventional new (i.e., unused) planar sputtering targets have flat round or flat quasi-rectangular shapes. For example, FIG. 1 depicts a new sputtering target 100 idealized as a rectangular prism. (In reality, planar sputtering targets are typically quasi-rectangular with rounded corners or are even round.) During sputtering, this shape is eroded away, and by the target's "end of life" (i.e., the point at which the used target is replaced by a new pristine target), typically only a portion of the target material has been utilized. Thus, the user of the sputter target typically must discard the remaining target material (and thus most of the remaining value of the original target). As described in U.S. Patent Application Publication Nos. 2008/0216602, 2008/0271779, and 2013/0156967 (the entire disclosures of which are incorporated by reference herein), this utilization dynamic makes sputter targets good candidates for refurbishment via spray deposition, e.g., cold spray.

However, sputtering targets are typically eroded away in a manner that provides an irregular surface at the target's end of life. FIG. 2 depicts a plan view of an eroded sputtering target 200 having a typical "racetrack" (or "annular") erosion pattern. This characteristic pattern, as well as its depth profile, is typically a result of the shape and intensity of the magnetic field applied by the magnetron during the sputtering process. The erosion pattern of eroded target 200 typically includes multiple regions of different depths. For example, the eroded target may have one or more deep pockets 210, which are regions of the most erosion (i.e., target utilization) and having the deepest surface depth. The deep pockets 210 may result from the "pinching" (i.e., increased intensity) of the magnetic field near ends 220 of the target 200, which causes erosion rates to be, e.g., 2-3× or even higher, the erosion rate in other locations of target 200. The depth of the deep pockets 210 typically determines the end of life of eroded target 200, as the target is typically replaced when this depth approaches the initial thickness (i.e., thickness prior to sputtering) of target 200. That is, the eroded target 200 is typically replaced when the bottom surface of the deep pockets 210 approaches the back surface of the target 200.

As shown, the erosion profile of eroded target 200 also includes one or more medium-depth regions 230 of less erosion and having shallower depths than those of deep pockets 210. The medium-depth regions 230 typically result from the shape of the magnetic field applied during sputtering, which tends to be less intense away from ends 220 of the target 200. The erosion profile of eroded target 200 also includes one or more shallow regions 240 from which little if any material of the target 200 is sputtered. That is, the thickness of the target 200 in shallow regions 240 may be only slightly less than, or even substantially equal to, the initial thickness of target 200 prior to sputtering (which may be, e.g., approximately 18 mm or even greater). As shown, the deep pockets 210 and the medium-depth regions 230 may collectively define at least a portion of a recessed annulus on target 200, where the deep pockets 210 correspond to opposite ends of the annulus near opposite ends of the target 200 (e.g., narrower ends of a substantially rectangular target 200). All or part of the center of the annulus may correspond to one or more of the shallow regions 240.

FIG. 3 is side view of an eroded target 200 depicting an exemplary surface contour (represented by the dashed line) extending from deep pockets 210 to the medium-depth region 230. In shallow regions 240 the target 200 has a thickness 300 that may be only slightly less than (e.g., 5% less than, or even less) or substantially equal to the initial thickness of target 200 prior to sputtering. As shown, the deep pockets 210 have depths 310 that extend deep into the thickness of target 200. For example, depth 310 may be greater than 50%, or even greater than 75%, of the initial thickness of target 200 prior to sputtering. Furthermore, the remaining thickness of the target 200 beneath deep pockets 210 (i.e., the difference between the initial thickness of target 200 and depth 310) may be, for example, in the range of 1 mm to 3 mm. Medium-depth regions 230 have considerably thicker remaining thicknesses of the target 200, and may have depths 320 of only 10%-25%, or even less, of the initial thickness of the target 200. As also shown in FIG. 3, the eroded target 200 is typically attached (e.g., bonded) to a backing plate 330 that supports the target 200 during the sputtering process and may act as a conduit for coolant (e.g., water) that regulates the temperature of target 200 during sputtering.

The irregular erosion profile of eroded target 200 presents challenges for a refurbishment process, and indeed, many eroded targets are simply recycled and replaced with new targets. Even spray refurbishment processes that selectively target the eroded racetrack pattern on target 200 can be time-consuming and expensive, and tend to require large amounts of the sprayed particulate material. Such processes may even require large spray-deposition tools and complicated robotics, and/or may require that the backing plate be removed prior to refurbishment (thus increasing the complexity, time, and expense of the process). Thus, there is a need for a refurbishment process that extends the useful life of eroded sputtering targets that may be performed quickly and inexpensively, and that does not require substantial amounts of sprayed material. Such a process would also advantageously provide refurbished targets having sputtering properties (e.g., sputter rate, sputtered film thickness, sputtered film uniformity) on par with those of the original target.

SUMMARY

Embodiments of the present invention enable the partial refurbishment of used (i.e., eroded) sputtering targets via spray deposition (e.g., cold spray) in order to extend their useful lives. (As utilized herein, "partial refurbishment" means that only a portion of the consumed material of the eroded sputtering target is replaced, and does not imply that additional refurbishment is required for further use of the sputtering target thereafter; rather, sputtering targets that are "partially refurbished" in accordance with embodiments of the present invention may be utilized for sputtering processes as if they were new.) Preferably only the areas of deepest erosion are at least partially filled with the sputtering material, resulting in a partially refurbished sputtering target that still contains eroded surface regions but that nonetheless may be utilized for additional sputtering processes. Since the target is only partially refurbished, the refurbishment process may be performed quite rapidly and with low utilization of the sprayed material, enabling the target to be quickly returned to service. Since the target material may be an expensive and/or exotic material, the low utilization of sprayed material advantageously saves material costs. Only small areas are typically refurbished, so the spray deposition may be performed with small spray-deposition systems (e.g., "hand-held" systems utilizing hand-held spray guns) and without complicated robotics in many embodiments. Furthermore, since the partial refurbishment is localized to particular areas, it produces less heating of the sputtering target, enabling refurbishment of the target with the backing plate (which typically includes or consists essentially of a lower-melting-point material such as copper and/or aluminum) in place, particularly in cases when the target is bonded to the backing plate via a low-melting-point bonding agent such as In solder (having melting points of, e.g., between 150° C. and 200° C.). For example, the sprayed target material may be deposited by cold spray at temperatures lower than the melting point of the hacking plate and/or lower than the melting point of the bonding agent used to affix the target to the backing plate. Preferred embodiments of the invention also do not require additional surface preparation (e.g., grinding or polishing) of the partially refurbished areas prior to or after spray deposition and before the partially refurbished target is again utilized in a sputtering process.

As mentioned above, embodiments of the invention enable refurbishment of an eroded sputtering target to the extent that the target may be again utilized for sputtering but while also minimizing consumption of the target material (which in many cases can be quite expensive). For example, one or more characteristics of the eroded sputtering target, or one or more regions thereof, may be identified in order to at least partially determine areas most in need of refurbishment. For example, surface depths and/or shapes of surface contours in various regions of the eroded target may be determined by, e.g., visual inspection and/or depth mapping (e.g., with a laser-based depth mapping system). The identified areas may then be at least partially filled with particulates of the target material by spray deposition while, during the spray deposition, deposition within other areas of the eroded sputtering target is minimized or substantially eliminated. For example, a mask having openings corresponding only to areas to be refurbished may be disposed over the eroded sputtering target prior to and during the spray deposition. In addition, any particles of the target material deposited on the mask may be recovered and recycled for future spray deposition or other uses. In various embodiments, with or without the mask, the spray refurbishment may be performed by an automated spraying system, and the relative motion between a robotically controlled spray gun and the eroded sputtering target (which may be disposed on a movable or stationary platform, framework, or gantry) is controlled (via, e.g., programming the robotic controls prior to spraying) such that the target material is sprayed only when the spray gun is disposed over the area(s) to be refurbished. Alternatively, the spray refurbishment may be performed with a hand-held spray gun, as mentioned above, which may be controlled by an operator to only spray the target material over the area(s) to be refurbished.

Moreover, embodiments of the invention enable spray deposition of the target material to partially refurbish a used sputtering target having a maximum surface depth (i.e., the difference between the maximum penetration and minimum penetration (the latter corresponding to, e.g., the original top surface and/or top surface after refurbishment) in the used target) greater than 9 mm, greater than 12 mm, or even larger. The remaining thickness of the used sputtering target in the regions to be refurbished may be, e.g., in the range of 1 mm to 3 mm. The spray-deposited layer preferably has low porosity, a gaseous and non-gaseous impurity content similar to that of the spent sputtering target, grain size and chemical homogeneity equal to or finer than the spent target (which may be, for example, a target not originally formed by spray deposition but rather by, e.g., ingot metallurgy or powder metallurgy), and a high-quality mechanical and/or metallurgical bond to the target material. Furthermore, the partial refurbishment in accordance with various embodiments of the present invention involves addition of so little material (compared to the volume of the entire sputtering target before or after use), that thermal and mechanical stresses produced during the refurbishment are greatly reduced compared with refurbishment processes in which larger amounts of the sputtering material are replaced.

Embodiments of the present invention utilize any of a variety of target materials for the partial refurbishment process, although the spray-deposited material is preferably that of the eroded target. In this manner, targets partially refurbished in accordance with embodiments of the invention may be utilized (i.e., sputtered) with substantially identical performance and properties of the original target, which is typically originally fabricated utilizing non-spray techniques, e.g., rolling and/or hot isostatic pressing, but which may also have been fabricated entirely or partially by spray deposition. In some embodiments, the target material includes, consists essentially of, or consists of one or more refractory metals, e.g., molybdenum (Mo), titanium (Ti), an alloy or mixture of molybdenum and titanium (Mo/Ti), niobium (Nb), tantalum (Ta), tungsten (W), zirconium (Zr), or mixtures or alloys of two or more of these or one or more of these with one or more additional metals. In some embodiments, the target material includes, consists essentially of, or consists of one or more other metals, e.g., aluminum (Al), copper (Cu), silver (Ag), gold (Au), nickel (Ni), or mixtures or alloys of two or more of these or one or more of these with one or more additional metals.

If necessary, after the deposition of the sprayed material, the partially refurbished target may be annealed to strengthen the bond between the spray-deposited material and the original target material. The annealing may be performed at a temperature of, e.g., between approximately 480° C. and approximately 700° C., or even to approximately 1050° C., and/or for a time of, e.g., between approximately 1 hour and approximately 16 hours. For example, the annealing may be performed at approximately 900° C. for approximately 4 hours. In some embodiments (e.g., for targets including, consisting essentially of, or consisting of lower melting point materials such as Al), the annealing may be performed at a temperature of, e.g., between approximately 100° C. and approximately 400° C., and/or for a time of, e.g., between approximately 0.5 hour and approximately 16 hours. The backing plate and low-temperature bonding agent (if present) may be removed from the target during the annealing process.

Prior to the spray deposition of the target material, substantially all or portions of the surface of the eroded target may be treated in order to provide a high-quality, clean, substantially oxide-free interface between the original target material and the newly deposited material. For example, the eroded surface may be grit blasted, machined, and/or etched (e.g., treated with acid) prior to the spray deposition.

In many embodiments, the interface between the eroded surface of the target and the spray-deposited material is detectable visually and/or by metallographic evaluation. For example, the spray-deposited material may exhibit improved metallurgical character (finer grain size and a finer degree of chemical homogeneity) than the original target material. Furthermore, the interface may be detectable via chemical analysis, as it may incorporate a finite concentration of impurities (e.g., oxygen and/or carbon) that is detectable (i.e., greater than a background level of the target) but that preferably has no deleterious impact on the sputtering process in which the partially refurbished target is employed.

While the embodiments of the invention detailed herein are mainly described in relation to originally substantially planar sputtering targets, embodiments of the invention may utilize non-planar sputter targets such as hollow-cathode magnetron or profiled targets (e.g., such as those described in U.S. Patent Application Publication No. 2011/0303535, the entire disclosure of which is incorporated by reference herein), and targets with life-extending "pads" in regions of anticipated sputtering-induced erosion.

As used herein, a "backing plate" is typically substantially planar, depending on the geometry of the sputtering target, and may include or consist essentially of one or more materials having a melting point less than that of the target material and/or less than the temperature of the spray material during spray deposition. In cases in which the sputtering target is at least partially tubular, the backing plate may be tubular or cylindrical. Exemplary materials for backing plates include copper and/or aluminum.

In an aspect, embodiments of the invention feature a method of refurbishing an eroded sputtering target while minimizing material consumption. The eroded sputtering target has a surface contour defining (i) an upper surface level, (ii) a first eroded region having a surface depth recessed below the upper surface level, and (iii) a second eroded region having a surface depth deeper than the surface depth of the first eroded region. The eroded sputtering target includes, consists essentially of, or consists of a target material. One or more characteristics of the second eroded region are identified, and particles of the target material are spray deposited to at least partially fill the second eroded region. During spray deposition of particles of the target material, deposition of particles of the target material in the first eroded region (and/or in areas of the eroded sputtering target outside of the first and second eroded regions) is substantially prevented, whereby the surface depth of the first eroded region remains recessed below the upper surface level thereafter.

Embodiments of the invention may include one or more of the following in any of a variety of combinations. The one or more characteristics of the second eroded region may include, consist essentially of, or consist of a difference between the surface depth of the second eroded region and the upper surface level, a shape of the surface contour of the eroded sputtering target in the second eroded region, and/or a difference between the surface depth of the second eroded region and the surface depth of the first eroded region. Substantially preventing deposition of particles of the target material in the first eroded region may include, consist essentially of, or consist of disposing a mask over at least a portion of the first eroded region. During spray deposition, particles of the target material may be deposited over the mask. After spray-deposition, the particles of the target material deposited over the mask may be recovered for use in future spray deposition and/or for other uses. Substantially preventing deposition of particles of the target material in the first eroded region may include, consist essentially of, or consist of programming an automated spraying apparatus to spray particles of the target material from a spray gun substantially only when the spray gun is disposed over the second eroded region. Substantially preventing deposition of particles of the target material in the first eroded region may include, consist essentially of, or consist of translating a hand-held spray gun substantially over only the second eroded region when the spray gun is spraying particles of the target material.

The sputtering target may be sputtered (i.e., utilized in a sputtering process) after spray deposition without deposition of target material in the first eroded region therebetween. No surface treatment (e.g., surface grinding and/or polishing and/or etching) may be performed on the sputtering target between the spray deposition and the sputtering. Spray-depositing particles of the target material may include, consist essentially of, or consist of cold spraying or plasma spraying. The target material may include, consist essentially of, or consist of Mo, Ti, Mo/Ti, Nb, Ta, W, Zr, Al, Cu, Ag, Au, Ni, a mixture of two or more thereof or one or more thereof with one or more other metals, or an alloy of two or more thereof or one or more thereof with one or more other metals. Before spray deposition, a volume of the second eroded region may be less than a volume of the first eroded region (i.e., the volume of the region refurbished during the partial refurbishment may be less than 50% of the total eroded volume of the eroded sputtering target). The spray-deposited particles that are at least partially filling the second eroded region, the at least partially filled second eroded region, or all or a portion of the partially refurbished sputtering target may be annealed. The annealing may be performed at a temperature and/or for a duration sufficient to partially or substantially completely relieve any stress/strain resulting from the spray deposition. The annealing may be performed at a temperature less that the melting point of the target material.

The eroded sputtering target may include, consist essentially of, or consist of a target plate of the target material and, affixed to the target plate, a backing plate including, consisting essentially of, or consisting of a backing-plate material different from the target material. The particles of the target material may be spray deposited on the target plate while the target plate is affixed to the backing plate. The target plate may be affixed to the backing plate with a bonding agent. The melting point of the bonding agent may be less than approximately 200° C. The bonding agent may include, consist essentially of, or consist of indium solder. The backing-plate material may include, consist essentially of, or consist of copper, aluminum, and/or steel (e.g., stainless steel). The particles of the target material may be spray deposited with a spraying apparatus that includes a handheld spray gun (rather than, e.g., an apparatus featuring a spray gun or spray nozzle configured for relative motion between the gun/nozzle and the article to be sprayed via robotics or other machine-based controls).

The eroded sputtering target may include, consist essentially of, or consist of a substantially rectangular target plate of the target material having first and second opposing ends (e.g., the shorter two ends of the substantially rectangular shape). The first eroded region may define at least a portion of an annulus, and the surface contour of at least a portion of a center of the annulus may correspond to the upper surface level. The second eroded region may include, consist essentially of, or consist of (i) a first end portion of the annulus defined by the first eroded region proximate the first end of the target plate and/or (ii) a second end portion of the annulus defined by the first eroded region proximate the second end of the target plate. The particles of the target material may be spray-deposited via a jet of sprayed particles, and an obliquity angle between the jet and the surface contour within the second eroded region may be between approximately 45° and approximately 90°. The obliquity angle may be between approximately 60° and approximately 90°. The second eroded region may be filled with the particles of the target material at least to (i.e., to a level approximately equal or coplanar to or higher than) the surface depth of the first eroded region. The second eroded region may be filled with the particles of the target material at least to (i.e., to a level approximately equal or coplanar to or higher than) the upper surface level (e.g., the topmost level outside of the second eroded region).

In another aspect, embodiments of the invention feature a method of partially refurbishing an eroded sputtering target having a surface contour defining (i) an upper surface level, (ii) a first eroded region having a surface depth recessed below the upper surface level, and (iii) a second eroded region having a surface depth deeper than the surface depth of the first eroded region. The eroded sputtering target includes, consists essentially of, or consists of a target material. Particles of the target material are spray-deposited to at least partially fill the second eroded region without filling the first eroded region. The surface depth of the first eroded region remains recessed below the upper surface level during and after the spray deposition (e.g., at least until the partially refurbished sputtering target is utilized in a sputtering process). No particles of the target material may be spray-deposited within the first eroded region, or some spray-deposition may be performed within the first eroded region, but the amount of material thus deposited is insufficient to fill the first eroded region to the upper surface level.

Embodiments of the invention may include one or more of the following in any of a variety of combinations. The sputtering target may be sputtered (i.e., utilized in a sputtering process) after spray deposition without deposition of target material in the first eroded region therebetween. No surface treatment (e.g., surface grinding and/or polishing and/or etching) may be performed on the sputtering target between the spray deposition and the sputtering. Spray-depositing particles of the target material may include, consist essentially of, or consist of cold spraying or plasma spraying. The target material may include, consist essentially of, or consist of Mo, Ti, Mo/Ti, Nb, Ta, W, Zr, Al, Cu, Ag, Au, Ni, a mixture of two or more thereof or one or more thereof with one or more other metals, or an alloy of two or more thereof or one or more thereof with one or more other metals. Before spray deposition, a volume of the second eroded region may be less than a volume of the first eroded region (i.e., the volume of the region refurbished during the partial refurbishment may be less than 50% of the total eroded volume of the eroded sputtering target). The spray-deposited particles that are at least partially filling the second eroded region, the at least partially filled second eroded region, or all or a portion of the partially refurbished sputtering target may be annealed. The annealing may be performed at a temperature and/or for a duration sufficient to partially or substantially completely relieve any stress/strain resulting from the spray deposition. The annealing may be performed at a temperature less that the melting point of the target material.

The eroded sputtering target may include, consist essentially of, or consist of a target plate of the target material and, affixed to the target plate, a backing plate including, consisting essentially of, or consisting of a backing-plate material different from the target material. The particles of the target material may be spray deposited on the target plate while the target plate is affixed to the backing plate. The target plate may be affixed to the backing plate with a bonding agent. The melting point of the bonding agent may be less than approximately 200° C. The bonding agent may include, consist essentially of, or consist of indium solder. The backing-plate material may include, consist essentially of, or consist of copper, aluminum, and/or steel (e.g., stainless steel). The particles of the target material may be spray deposited with a spraying apparatus that includes a handheld spray gun (rather than, e.g., an apparatus featuring a spray gun or spray nozzle configured for relative motion between the gun/nozzle and the article to be sprayed via robotics or other machine-based controls).

The eroded sputtering target may include, consist essentially of, or consist of a substantially rectangular target plate of the target material having first and second opposing ends (e.g., the shorter two ends of the substantially rectangular shape). The first eroded region may define at least a portion of an annulus, and the surface contour of at least a portion of a center of the annulus may correspond to the upper surface level. The second eroded region may include, consist essentially of, or consist of (i) a first end portion of the annulus defined by the first eroded region proximate the first end of the target plate and/or (ii) a second end portion of the annulus defined by the first eroded region proximate the second end of the target plate. The particles of the target material may be spray-deposited via a jet of sprayed particles, and an obliquity angle between the jet and the surface contour within the second eroded region may be between approximately 45° and approximately 90°. The obliquity angle may be between approximately 60° and approximately 90°. The second eroded region may be filled with the particles of the target material at least to (i.e., to a level approximately equal or coplanar to or higher than) the surface depth of the first eroded region. The second eroded region may be filled with the particles of the target material at least to (i.e., to a level approximately equal or coplanar to or higher than) the upper surface level (e.g., the topmost level outside of the second eroded region).

In another aspect, embodiments of the invention feature a method of sputtering a target material. A sputtering target that includes, consists essentially of, or consists of the target material is disposed within a first sputtering tool. Target material is sputtered (i.e., removed via bombardment with ions) from the sputtering target to form an eroded region having a surface contour defining a plurality of different depths recessed below a top surface of the sputtering target. Particles (e.g., powder particles) of the target material are spray-deposited to at least partially fill only a first portion of the eroded region without filling a second portion of the eroded region proximate the first portion (e.g., without spray-depositing particles in a second portion of the eroded region, or by spray-depositing an insufficient amount of the particles to fill the second portion of the eroded region), thereby forming a partially refurbished sputtering target. The partially refurbished sputtering target is disposed within a second sputtering tool, and target material is sputtered from the partially refurbished sputtering target.

Embodiments of the invention may include one or more of the following in any of a variety of combinations. One or more characteristics of the first portion of the eroded region may be identified, e.g., before spray-depositing particles of the target material. The one or more characteristics of the first portion of the eroded region may include, consist essentially of, or consist of a depth of the first portion of the eroded region, a shape of the surface contour in the first portion of the eroded region, and/or a difference between a depth of the first portion of the eroded region and a depth of the second portion of the eroded region. A mask may be disposed over (and even in contact with) at least a portion of the sputtering target before spray-depositing particles of the target material. The mask may define one or more openings that reveal at least some of the first portion of the eroded region. During spray deposition, particles of the target material may be deposited over the mask. After spray deposition, the particles of the target material deposited over the mask may be recovered for future use. An automated spraying apparatus may be programmed to spray particles of the target material from a spray gun substantially only when the spray gun is disposed over the first portion of the eroded region. During spray deposition, a hand-held spray gun may be translated substantially over only the first portion of the eroded region when the spray gun is spraying particles of the target material.

A maximum depth of the eroded region below the top surface of the sputtering target prior to spray deposition may be disposed in the first portion of the eroded region. The first and second sputtering tools may be the same sputtering tool or different sputtering tools. No surface treatment (e.g., surface grinding and/or polishing and/or etching) may be performed on the partially refurbished sputtering target between the spray deposition and disposing the partially refurbished sputtering target within the second sputtering tool. Spray-depositing particles of the target material may include, consist essentially of, or consist of cold spraying or plasma spraying. The target material may include, consist essentially of, or consist of Mo, Ti, Mo/Ti, Nb, Ta, W, Zr, Al, Cu, Ag, Au, Ni, a mixture of two or more thereof or one or more thereof with one or more other metals, or an alloy of two or more thereof or one or more thereof with one or more other metals. Before spray deposition, a volume of the first portion of the eroded region may be less than a volume of the second portion of the eroded region (i.e., the volume of the region refurbished during the partial refurbishment may be less than 50% of the total eroded volume of the eroded sputtering target). The spray-deposited particles that are at least partially filling the first portion of the eroded region, the at least partially filled first portion of the eroded region, or all or a portion of the partially refurbished sputtering target may be annealed before or after it is disposed within the second sputtering tool. The annealing may be performed at a temperature and/or for a duration sufficient to partially or substantially completely relieve any stress/strain resulting from the spray deposition. The annealing may be performed at a temperature less that the melting point of the target material.

The sputtering target may include, consist essentially of, or consist of a target plate of the target material and, affixed to the target plate, a backing plate that includes, consists essentially of, or consists of a backing-plate material different from the target material. The particles of the target material may be spray deposited on the target plate while the target plate is affixed to the backing plate. The target plate may be affixed to the backing plate with a bonding agent. The melting point of the bonding agent may be less than approximately 200° C. The bonding agent may include, consist essentially of, or consist of indium solder. The backing-plate material may include, consist essentially of, or consist of copper, aluminum, and/or steel (stainless steel). The particles of the target material may be spray deposited with a spraying apparatus that includes a hand-held spray gun (rather than, e.g., an apparatus featuring a spray gun or spray nozzle configured for relative motion between the gun/nozzle and the article to be sprayed via robotics or other machine-based controls).

The sputtering target may include, consist essentially of, or consist of a substantially rectangular target plate of the target material having first and second opposing ends (e.g., the shorter two ends of the substantially rectangular shape). The eroded region may define at least a portion of an annulus, and the surface contour of at least a portion of a center of the annulus may correspond to the top surface of the sputtering target. The first portion of the eroded region may include, consist essentially of, or consist of (i) a first end portion of the annulus defined by the eroded region proximate the first end of the target plate and/or (ii) a second end portion of the annulus defined by the eroded region proximate the second end of the target plate. The particles of the target material may be spray-deposited via a jet of sprayed particles, and an obliquity angle between the jet and the surface contour within the first portion of the eroded region may be between approximately 45° and approximately 90°. The obliquity angle may be between approximately 60° and approximately 90°. The first portion of the eroded region may be filled with the particles of the target material at least to a depth of (i.e., to a level approximately equal or coplanar to or higher than) the second portion of the eroded region. The first portion of the eroded region may be filled with the particles of the target material at least to a depth of (i.e., to a level approximately equal or coplanar to or higher than) the top surface of the sputtering target (i.e., the topmost surface of the sputtering target outside of the first portion of the eroded region).

In yet another aspect, embodiments of the invention feature a partially refurbished sputtering target that includes, consists essentially of, or consists of a target plate and a layer of unmelted metal powder. The target plate includes, consists essentially of, or consists of a target material. The target plate has a surface contour defining (a) a top surface and (h) a recessed region having a surface recessed below the top surface. The layer of unmelted metal powder is disposed on the target plate adjacent or proximate the recessed region. The layer of unmelted metal powder has a top surface (a) approximately coplanar with the top surface of the target plate or (b) recessed below the top surface to a depth shallower than or substantially equal to a depth of the surface of the recessed region. The layer of unmelted metal powder has an interface with the plate disposed at a depth deeper than the depth of the surface of the recessed region.

Embodiments of the invention may include one or more of the following in any of a variety of combinations. The top surface of the layer of unmelted metal powder may be approximately coplanar with the top surface of the target plate. The top surface of the layer of unmelted metal powder may be recessed below the top surface to a depth shallower than the depth of the surface of the recessed region. The top surface of the layer of unmelted metal powder may be recessed below the top surface to a depth substantially equal to the depth of the surface of the recessed region. The target plate may be disposed within a sputtering tool. The layer of unmelted metal powder may include, consist essentially of, or consist of the target material. A backing plate may be affixed to the target plate. The backing plate may include, consist essentially of, or consist of a material having a melting point lower than a melting point of the target material. The backing plate may include, consist essentially of, or consist of copper, aluminum, and/or steel (e.g., stainless steel). The target plate may be affixed to the backing plate with a bonding agent. A melting point of the bonding agent may be less than approximately 200° C. The bonding agent may include, consist essentially of, or consist of indium solder.

The target plate may have a first grain size and a first crystalline microstructure. The layer of unmelted metal powder may have (i) a second grain size finer than the first grain size, and/or (ii) a second crystalline microstructure more random than (i.e., having less preferred crystallographic texture or orientation than) the first crystalline microstructure. The first and second grain sizes may be average grain sizes. The target plate may have been initially formed by ingot metallurgy or powder metallurgy. There may be a distinct boundary line between the target plate and the layer of unmelted powder. The target material may include, consist essentially of, or consist of Mo, Ti, Mo/Ti, Nb, Ta, W, Zr, Al, Cu, Ag, Au, Ni, a mixture of two or more thereof or one or more thereof with one or more other metals, or an alloy of two or more thereof or one or more thereof with one or more other metals. The volume of the layer of unmelted metal powder may be less than a volume of the recessed region. The target plate may be substantially rectangular and have first and second opposing ends (e.g., the shorter ends of the substantially rectangular shape). The recessed region and the layer of unmelted metal powder may collectively define at least a portion of an annulus, and the surface contour of at least a portion of a center of the annulus may correspond to the top surface of the target plate. The layer of unmelted metal powder may be disposed within (i) a first end portion of the annulus proximate the first end of the target plate and/or (ii) a second end portion of the annulus proximate the second end of the target plate.

In yet another aspect, embodiments of the invention feature a method of sputtering a target material. A partially refurbished sputtering target is disposed within a sputtering tool, and target material is sputtered from the partially refurbished sputtering target (and, e.g., deposited upon an article within the sputtering tool). The partially refurbished sputtering target includes, consists essentially of, or consists of a target plate and a layer of unmelted metal powder. The target plate includes, consists essentially of, or consists of the target material. The target plate has a surface contour defining (a) a top surface and (b) a recessed region having a surface recessed below the top surface. The layer of unmelted metal powder is disposed on the target plate adjacent or proximate the recessed region. The layer of unmelted metal powder has a top surface (a) approximately coplanar with the top surface of the target plate or (b) recessed below the top surface to a depth shallower than or substantially equal to a depth of the surface of the recessed region. The layer of unmelted metal powder has an interface with the plate disposed at a depth deeper than the depth of the surface of the recessed region.

Embodiments of the invention may include one or more of the following in any of a variety of combinations. The partially refurbished sputtering target may be formed by providing an eroded sputtering target having a surface contour defining (i) an upper surface level, (ii) a first eroded region having a surface depth recessed below the upper surface level, and (iii) a second eroded region having a surface depth deeper than the surface depth of the first eroded region, and then spray-depositing particles of the target material to at least partially fill the second eroded region without filling the first eroded region (e.g., without spray-deposition in the first eroded region, or without sufficient spray-deposition in the first eroded region to fill the first eroded region to the upper surface level). The partially refurbished sputtering target may be formed by providing an eroded sputtering target having a surface contour defining (i) an upper surface level, (ii) a first eroded region having a surface depth recessed below the upper surface level, and (iii) a second eroded region having a surface depth deeper than the surface depth of the first eroded region, identifying one or more characteristics of the second eroded region, spray-depositing particles of the target material to at least partially fill the second eroded region, and during spray deposition of particles of the target material, substantially preventing deposition of particles of the target material in the first eroded region, whereby the surface depth of the first eroded region remains recessed below the upper surface level thereafter.

The eroded sputtering target may include, consist essentially of, or consist of the target material. The top surface of the layer of unmelted metal powder may be approximately coplanar with the top surface of the target plate. The top surface of the layer of unmelted metal powder may be recessed below the top surface to a depth shallower than the depth of the surface of the recessed region. The top surface of the layer of unmelted metal powder may be recessed below the top surface to a depth substantially equal to the depth of the surface of the recessed region. The layer of unmelted metal powder may include, consist essentially of, or consist of the target material. A backing plate may be affixed to the target plate. The backing plate may include, consist essentially of, or consist of a material having a melting point lower than a melting point of the target material. The backing plate may include, consist essentially of, or consist of copper, aluminum, and/or steel (e.g., stainless steel). The target plate may be affixed to the backing plate with a bonding agent. A melting point of the bonding agent may be less than approximately 200° C. The bonding agent may include, consist essentially of, or consist of indium solder.

The target plate may have a first grain size and a first crystalline microstructure. The layer of unmelted metal powder may have (i) a second grain size finer than the first grain size, and/or (ii) a second crystalline microstructure more random than the first crystalline microstructure. The target plate (or at least a portion thereof) may have been initially formed by ingot metallurgy or powder metallurgy. There may be a distinct boundary line between the target plate and the layer of unmelted powder. The target material may include, consist essentially of, or consist of Mo, Ti, Mo/Ti, Nb, Ta, W, Zr, Al, Cu, Ag, Au, Ni, a mixture of two or more thereof or one or more thereof with one or more other metals, or an alloy of two or more thereof or one or more thereof with one or more other metals. The volume of the layer of unmelted metal powder may be less than the volume of the recessed region. The target plate may be substantially rectangular and have first and second opposing ends (e.g., the shorter ends of the substantially rectangular shape). The recessed region and the layer of unmelted metal powder may collectively define at least a portion of an annulus, and the surface contour of at least a portion of a center of the annulus may correspond to the top surface of the target plate. The layer of unmelted metal powder may be disposed within (i) a first end portion of the annulus proximate the first end of the target plate and/or (ii) a second end portion of the annulus proximate the second end of the target plate (i.e., the layer of unmelted metal powder may be composed of multiple distinct regions that are not in contact with each other).

In another aspect, embodiments of the invention feature a method of sputtering a target material. A partially refurbished sputtering target is disposed within a sputtering tool, and target material is sputtered from the partially refurbished sputtering target (and, e.g., deposited upon an article within the sputtering tool). The partially refurbished sputtering target is formed by providing an eroded sputtering target having a surface contour defining (i) an upper surface level, (ii) a first eroded region having a surface depth recessed below the upper surface level, and (iii) a second eroded region having a surface depth deeper than the surface depth of the first eroded region, and spray-depositing particles of the target material. The particles of the target material are spray-deposited to at least partially fill the second eroded region without filling the first eroded region. The surface depth of the first eroded region remains recessed below the upper surface level during and after the spray deposition (e.g., at least until the partially refurbished sputtering target is utilized in the sputtering process). No particles of the target material may be spray-deposited within the first eroded region, or some spray-deposition may be performed within the first eroded region, but the amount of material thus deposited is insufficient to fill the first eroded region to the upper surface level.

Embodiments of the invention may include one or more of the following in any of a variety of combinations. The partially refurbished sputtering target may include, consist essentially of, or consist of a target plate and a layer of unmelted metal powder. The target plate may include, consist essentially of, or consist of the target material. The target plate may have a surface contour defining (a) a top surface and (b) a recessed region having a surface recessed below the top surface. The layer of unmelted metal powder may have a top surface (a) approximately coplanar with the top surface of the target plate or (b) recessed below the top surface to a depth shallower than or substantially equal to a depth of the surface of the recessed region. The layer of unmelted metal powder may have an interface with the plate disposed at a depth deeper than the depth of the surface of the recessed region. The top surface of the layer of unmelted metal powder may be approximately coplanar with the top surface of the target plate. The top surface of the layer of unmelted metal powder may be recessed below the top surface to a depth shallower than the depth of the surface of the recessed region. The top surface of the layer of unmelted metal powder may be recessed below the top surface to a depth substantially equal to the depth of the surface of the recessed region.

The target plate may have a first grain size and a first crystalline microstructure. The layer of unmelted metal powder may have (i) a second grain size finer than the first grain size, and/or (ii) a second crystalline microstructure more random than the first crystalline microstructure. The target plate may have been initially formed by ingot metallurgy or powder metallurgy. There may be a distinct boundary line between the target plate and the layer of unmelted powder. The partially refurbished sputtering target may include a backing plate disposed beneath the target material. The backing plate may include, consist essentially of, or consist of a material having a melting point lower than a melting point of the target material. The backing plate may include, consist essentially of, or consist of copper, aluminum, and/or steel (e.g., stainless steel). The target material may be affixed to the backing plate with a bonding agent. A melting point of the bonding agent may be less than approximately 200° C. The bonding agent may include, consist essentially of, or consist of indium solder.

The target material may include, consist essentially of, or consist of Mo, Ti, Nb, Ta, W, Zr, Al, Cu, Ag, Au, Ni, a mixture of two or more thereof or one or more thereof with one or more other metals, or an alloy of two or more thereof or one or more thereof with one or more other metals. Before spray deposition, a volume of the second eroded region may be less than a volume of the first eroded region (i.e., the volume of the region refurbished during the partial refurbishment may be less than 50% of the total eroded volume of the eroded sputtering target). The eroded sputtering target may include, consist essentially of, or consist of a substantially rectangular target plate of the target material having first and second opposing ends (e.g., the shorter ends of the substantially rectangular shape). The first eroded region may define at least a portion of an annulus, and the surface contour of at least a portion of a center of the annulus may correspond to the upper surface level. The second eroded region may include, consist essentially of, or consist of (i) a first end portion of the annulus defined by the first eroded region proximate the first end of the target plate and/or (ii) a second end portion of the annulus defined by the first eroded region proximate the second end of the target plate. The second eroded region may be filled with the particles of the target material at least to the surface depth of the first eroded region. The second eroded region may be filled with the particles of the target material at least to the upper surface level.

In another aspect, embodiments of the invention feature a method of sputtering a target material. A partially refurbished sputtering target is disposed within a sputtering tool, and target material is sputtered from the partially refurbished sputtering target (and, e.g., deposited upon an article within the sputtering tool). The partially refurbished sputtering target is formed by providing an eroded sputtering target having a surface contour defining (i) an upper surface level, (ii) a first eroded region having a surface depth recessed below the upper surface level, and (iii) a second eroded region having a surface depth deeper than the surface depth of the first eroded region, identifying one or more characteristics of the second eroded region, spray-depositing particles of the target material, and, during spray deposition of particles of the target material, substantially preventing deposition of particles of the target material in the first eroded region, whereby the surface depth of the first eroded region remains recessed below the upper surface level thereafter. The particles of the target material are spray-deposited to at least partially fill the second eroded region without filling the first eroded region. The surface depth of the first eroded region remains recessed below the upper surface level during and after the spray deposition (e.g., at least until the partially refurbished sputtering target is utilized in the sputtering process). No particles of the target material may be spray-deposited within the first eroded region, or some spray-deposition may be performed within the first eroded region, but the amount of material thus deposited is insufficient to fill the first eroded region to the upper surface level.

Embodiments of the invention may include one or more of the following in any of a variety of combinations. The partially refurbished sputtering target may include, consist essentially of, or consist of a target plate and a layer of unmelted metal powder. The target plate may include, consist essentially of, or consist of the target material. The target plate may have a surface contour defining (a) a top surface and (b) a recessed region having a surface recessed below the top surface. The layer of unmelted metal powder may have a top surface (a) approximately coplanar with the top surface of the target plate or (b) recessed below the top surface to a depth shallower than or substantially equal to a depth of the surface of the recessed region. The layer of unmelted metal powder may have an interface with the plate disposed at a depth deeper than the depth of the surface of the recessed region. The top surface of the layer of unmelted metal powder may be approximately coplanar with the top surface of the target plate. The top surface of the layer of unmelted metal powder may be recessed below the top surface to a depth shallower than the depth of the surface of the recessed region. The top surface of the layer of unmelted metal powder may be recessed below the top surface to a depth substantially equal to the depth of the surface of the recessed region.

The target plate may have a first grain size and a first crystalline microstructure. The layer of unmelted metal powder may have (i) a second grain size finer than the first grain size, and/or (ii) a second crystalline microstructure more random than the first crystalline microstructure. The target plate may have been initially formed by ingot metallurgy or powder metallurgy. There may be a distinct boundary line between the target plate and the layer of unmelted powder. The partially refurbished sputtering target may include a backing plate disposed beneath the target material. The backing plate may include, consist essentially of, or consist of a material having a melting point lower than a melting point of the target material. The backing plate may include, consist essentially of, or consist of copper, aluminum, and/or steel (e.g., stainless steel). The target material may be affixed to the backing plate with a bonding agent. A melting point of the bonding agent may be less than approximately 200° C. The bonding agent may include, consist essentially of, or consist of indium solder.

The target material may include, consist essentially of, or consist of Mo, Ti, Mo/Ti, Nb, Ta, W, Zr, Al, Cu, Ag, Au, Ni, a mixture of two or more thereof or one or more thereof with one or more other metals, or an alloy of two or more thereof or one or more thereof with one or more other metals. Before spray deposition, a volume of the second eroded region may be less than a volume of the first eroded region (i.e., the volume of the region refurbished during the partial refurbishment may be less than 50% of the total eroded volume of the eroded sputtering target). The eroded sputtering target may include, consist essentially of, or consist of a substantially rectangular target plate of the target material having first and second opposing ends (e.g., the shorter ends of the substantially rectangular shape). The first eroded region may define at least a portion of an annulus, and the surface contour of at least a portion of a center of the annulus may correspond to the upper surface level. The second eroded region may include, consist essentially of, or consist of (i) a first end portion of the annulus defined by the first eroded region proximate the first end of the target plate and/or (ii) a second end portion of the annulus defined by the first eroded region proximate the second end of the target plate. The second eroded region may be filled with the particles of the target material at least to the surface depth of the first eroded region. The second eroded region may be filled with the particles of the target material at least to the upper surface level.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "cold spray" or "cold-spray technique" refers to techniques in which one or more powders are spray-deposited without melting during spraying, e.g., cold spray, kinetic spray, and the like. The sprayed powders may be heated prior to and during deposition, but only to temperatures below their melting points. As used herein, the terms "approximately" and "substantially" mean ±10%, and in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
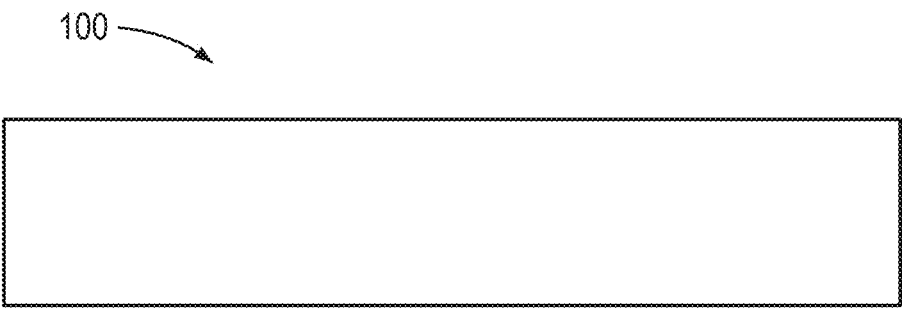
FIG. 1 is a schematic plan view of an unused planar sputtering target.
Figure 2:
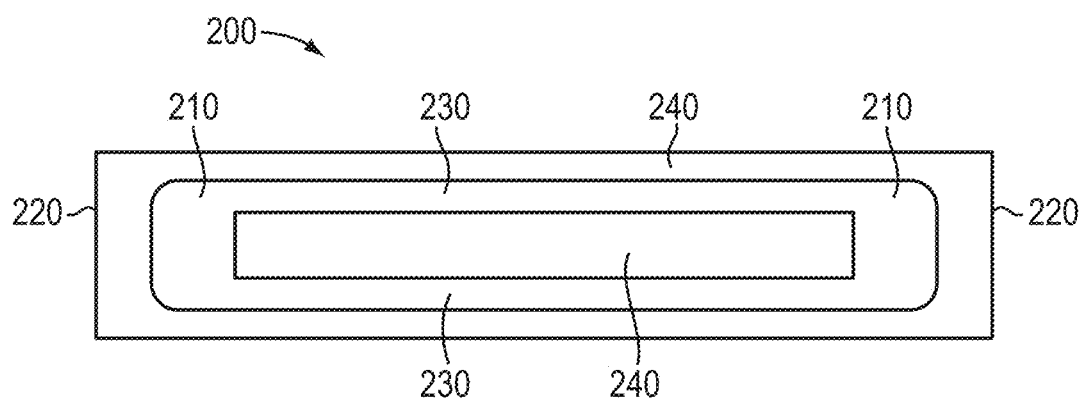
FIG. 2 is a schematic plan view of an eroded planar sputtering target that may be partially refurbished in accordance with various embodiments of the invention.
Figure 3:
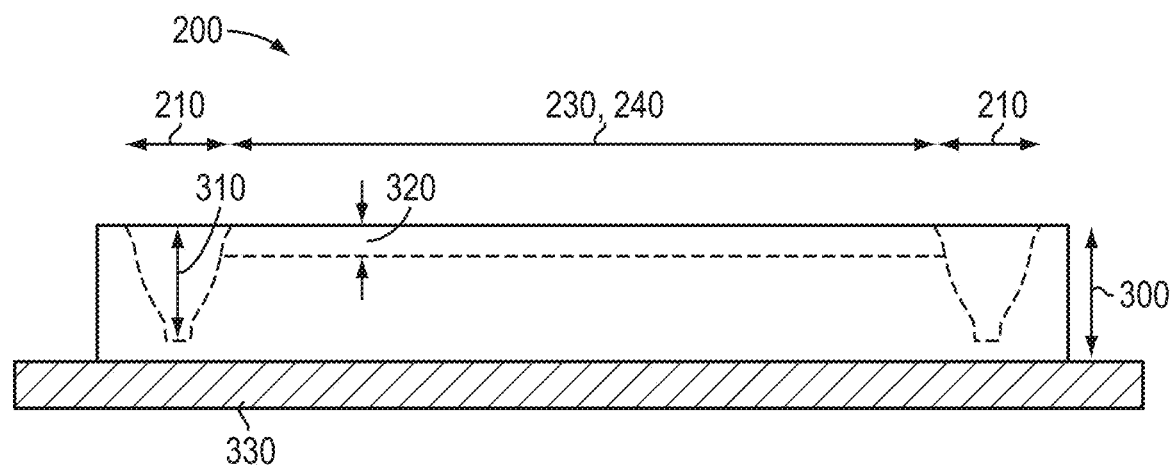
FIG. 3 is a schematic side view of an eroded sputtering target mounted on a backing plate.

Referring back to FIG. 3, the eroded sputtering target 200 is partially refurbished in accordance with various embodiments of the present invention. The target 200 may include or consist essentially of one or more (e.g., as an alloy or mixture) of sputterable materials, e.g., metals. In some embodiments, the target material (i.e., the material of target 200) includes, consists essentially of, or consists of one or more refractory metals, e.g., Mo, Ti, Mo/Ti, Nb, Ta, W, Zr, or mixtures or alloys thereof. In some embodiments, the target material includes, consists essentially of, or consists of, e.g., Al, Cu, Ag, Au, Ni, or mixtures or alloys thereof. The target 200 is typically bonded or otherwise affixed to a backing plate 330 for sputtering (e.g., via In solder), but target 200 may be partially refurbished in accordance with embodiments of the present invention with the backing plate present or removed. In some embodiments, one or more characteristics of the eroded sputtering target 200, or one or more regions thereof, may be identified in order to at least partially determine areas most in need of refurbishment (for example, the deep pockets 210). For example, surface depths and/or shapes of surface contours in various regions of the eroded sputtering target 200 (e.g., the deep pockets 210, the medium-depth regions 230, and/or the shallow regions 240) may be determined by, e.g., visual inspection and/or depth mapping (e.g., with a laser-based depth mapping system). The coordinates and/or the shapes of the identified areas may be utilized to control the partial refurbishment process as detailed below.

Figure 4A:
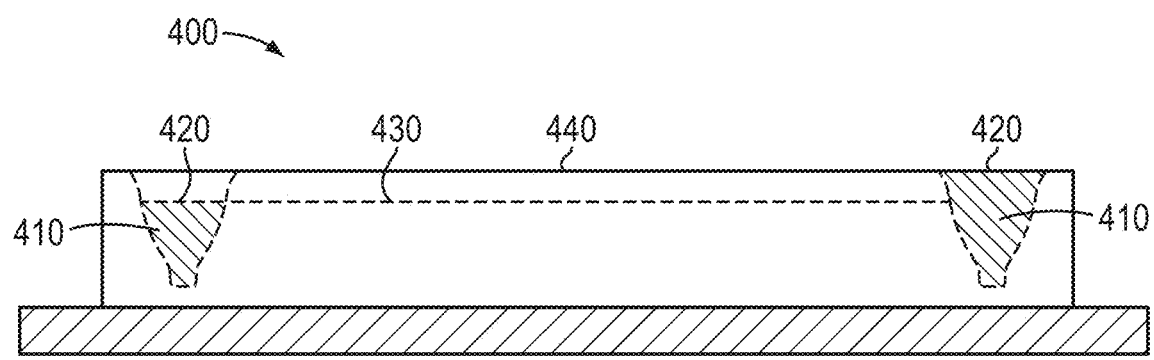
FIG. 4A is a schematic side view of a used sputtering target, attached to a backing plate, which has been partially refurbished in accordance with various embodiments of the invention.

FIG. 4A depicts a cross-section of a partially refurbished sputtering target 400 that has been partially refurbished in accordance with embodiments of the invention. As shown, medium-depth regions 230 are preferably not refurbished, i.e., not at least partially refilled with target material via spray deposition. Rather, only the deep pockets 210 are at least partially filled with sprayed material 410 via spray deposition. Preferably the spray-deposition process includes or consists essentially of cold spray, and is performed below the melting points of the material of target 400 (which typically corresponds to the sprayed material 410) and/or the material of the backing plate 330 (and/or the bonding agent utilized to attack target 400 to the backing plate 330). Prior to the spray deposition, the surface of the eroded target 400 may be treated to provide a high-quality, clean, substantially oxide-free interface between the original target material and the newly deposited material. For example, the eroded surface may be grit blasted, machined, and/or etched (e.g., with acid) prior to the spray deposition.

Figure 4B:
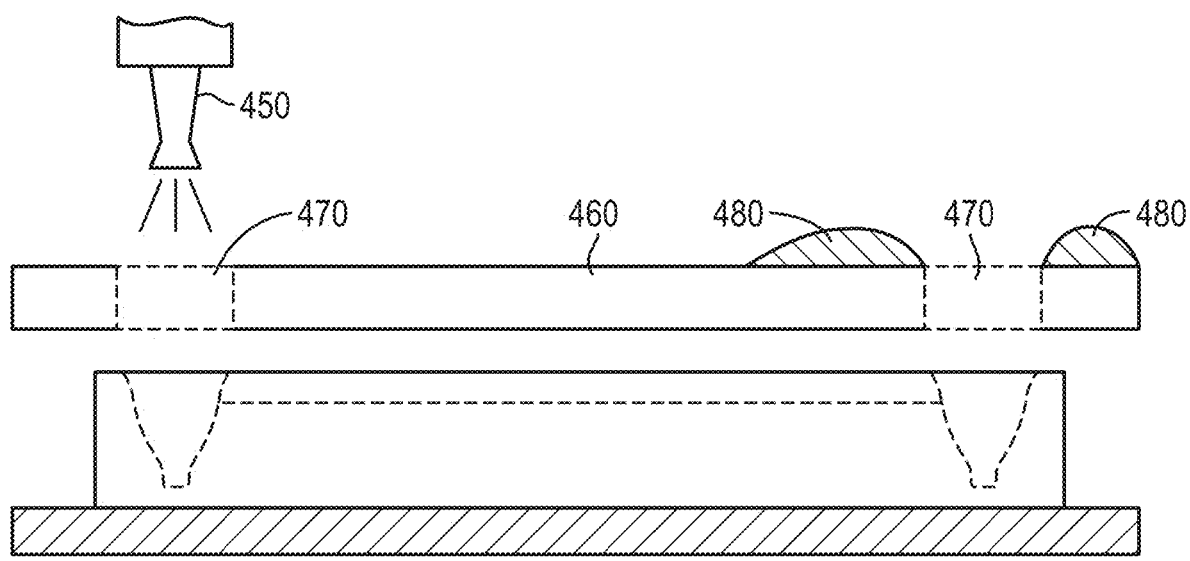
FIG. 4B is a schematic side view of a used sputtering target, attached to a backing plate, during partial refurbishment in accordance with various embodiments of the invention.

As shown in FIG. 4B, after the optional surface treatment, spray deposition is initiated by positioning a spray-deposition gun 450 over each of the deep pockets 210. The spray-deposition gun may be a portion of a spray-deposition system (e.g., a cold-spray deposition system), for example, one of the systems described in U.S. Pat. No. 5,302,414, filed on Feb. 2, 1992, U.S. Pat. No. 6,139,913, filed on Jun. 29, 1999, U.S. Pat. No. 6,502,767, filed on May 2, 2001, or U.S. Pat. No. 6,722,584, filed on Nov. 30, 2001, the entire disclosure of each of which is incorporated by reference herein.

The spray-deposition gun 450 receives the material to be sprayed (which preferably matches the material of target 400) in powder (i.e., particulate) form, e.g., from a powder feeder (not shown), accelerates the powder, and sprays the powder (typically from a nozzle) in a jet that strikes the surface of deep pocket 210 and is deposited as a layer of material. The density of the deposited layer is typically greater than 97%, and preferably greater than 99%. As the sprayed material is deposited, the gun 450 is translated across the deep pocket 210 and/or, equivalently, the eroded target is itself translated beneath the gun 450 (i.e., the gun 450 may be held stationary in some embodiments of the invention), generating a dense layer of the target material having a thickness of approximately 100 µm to approximately 500 µm with each pass of the gun over the deep pocket 210.

As shown in FIG. 4B, in some embodiments, the spray deposition of the target material is minimized or substantially eliminated by disposing a mask 460 over all of a portion of the partially eroded sputtering target. The mask 460 may include, consist essentially of, or consist of a suitably rigid or semi-rigid material capable of withstanding the stream of sprayed material without appreciable damage or erosion, e.g., a metallic, plastic, or ceramic material. The mask 460 defines one or more openings 470 therethrough that reveal the area(s) of the eroded sputtering target to be refurbished (e.g., the deep pockets 210) while leaving most or all of the remaining area of the target covered. During the spray deposition, particulates of the sprayed material may form accumulations 480 on portions of the mask 460. Such material may be recovered and/or recycled for future spray deposition or for other uses. Thus, utilization of the mask 460 may enable spray refurbishment of targeted areas without requiring absolute accuracy in the placement and movement of the gun 450. In fact, in various embodiments the gun 450 may even be translated (and even be spraying) over the entire eroded target, and material striking and/or accumulating on the mask 460 rather than in the areas to be refurbished may be recovered for future use.

In various embodiments, either with or without the mask 460 present, the gun 450 may be controlled to substantially only spray particulates of material when disposed over the areas of the eroded sputtering target to be refurbished (e.g., the deep pockets 210). For example, the spray refurbishment may be performed by an automated spraying system in which the relative motion between the gun 450 and the target is robotically controlled (via movement of the gun 450, the target, or both). In various embodiments, the depth and/or surface contour information obtained from the eroded sputtering target may be utilized to program the system to perform the relative movement between the gun 450 and the target, such that the particulate material is sprayed only when the gun 450 is disposed over the area(s) to be refurbished. Alternatively, the particulate material may be sprayed at a reduced rate when the gun 450 is disposed over area(s) not to be refurbished, and/or the system may be programmed for relative movement between the gun 450 and the target that is faster when the gun 450 is disposed over area(s) not to be refurbished; thus, the amount of particulate material (if any) sprayed over such areas is minimized or substantially eliminated. In other embodiments of the invention, the spray refurbishment may be performed with a hand-held spray gun 450, as mentioned above, which may be controlled by an operator to only spray the particulate material over the area(s) to be refurbished.

As shown in FIG. 4A, after the partial refurbishment process, the target 400 includes sprayed material 410 at least partially filling the deep pockets 210. Sprayed material 410 typically includes or consists essentially of unmelted powder of the material of plate 400. In preferred embodiments, the sprayed material 410 at least partially fills the deep pockets 210 such that a surface 420 in such regions is at least substantially coplanar with a surface 430 in medium-depth regions 230 (as shown for the left-hand deep pocket 210 in FIG. 4A). As also shown, the surface 420 may extend above surface 430, but is preferably lower or substantially coplanar with a surface 440 of the shallow regions 240 (as shown for the right-hand deep pocket 210 in FIG. 4A). Thus, in general, preferred surfaces 420 lie along surface 430, along surface 440, or between surfaces 430, 440. After the partial refurbishment of target 400, it may be placed back into the sputtering tool and utilized for additional sputtering processes. Such additional sputtering may result again in non-uniform consumption of surface material, and the resulting deep pockets may again be at least partially filled in a subsequent partial refurbishment process. In this manner, a single sputtering target may be partially refurbished multiple times (while being sputtered therebetween) before full refurbishment or recycling of the target is required.

Figure 5:
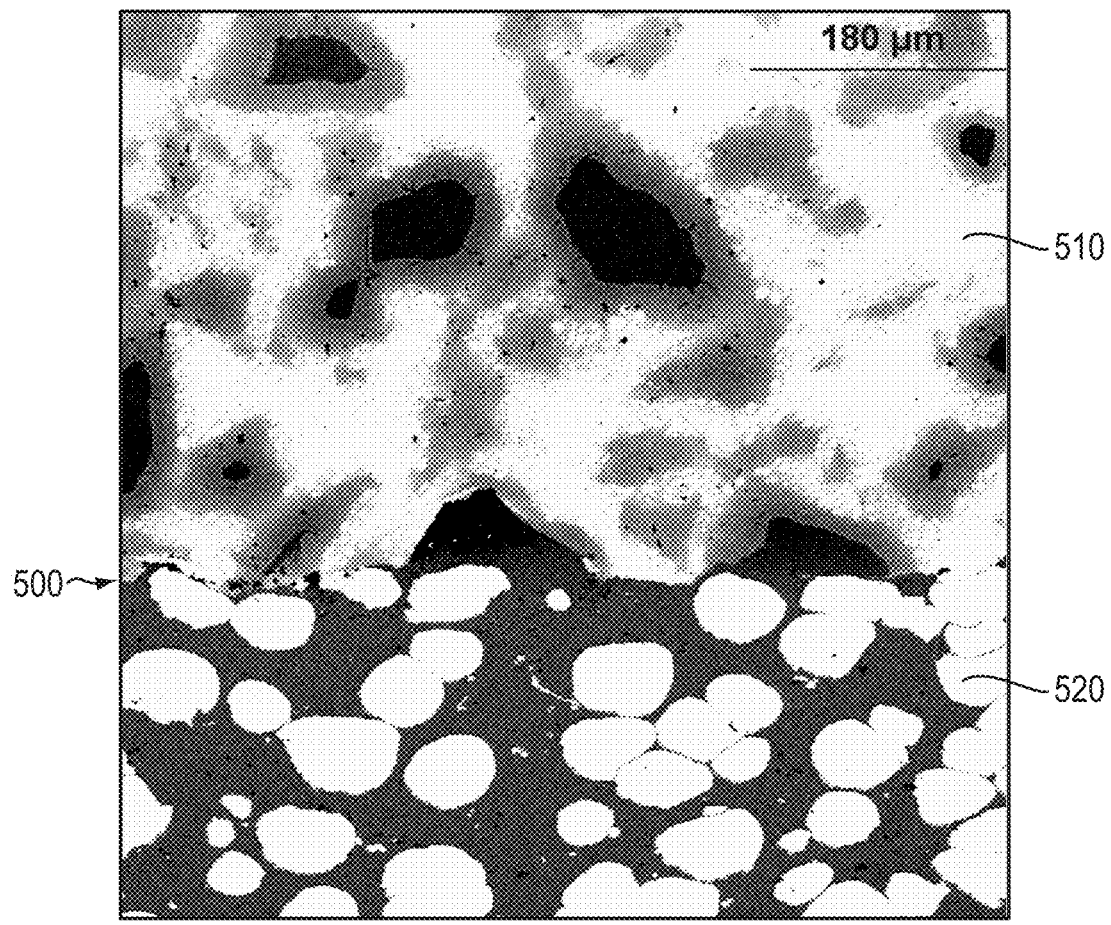
FIGS. 5 and 6 are micrographs of portions of partially refurbished sputtering targets in accordance with various embodiments of the invention.
Figure 6:
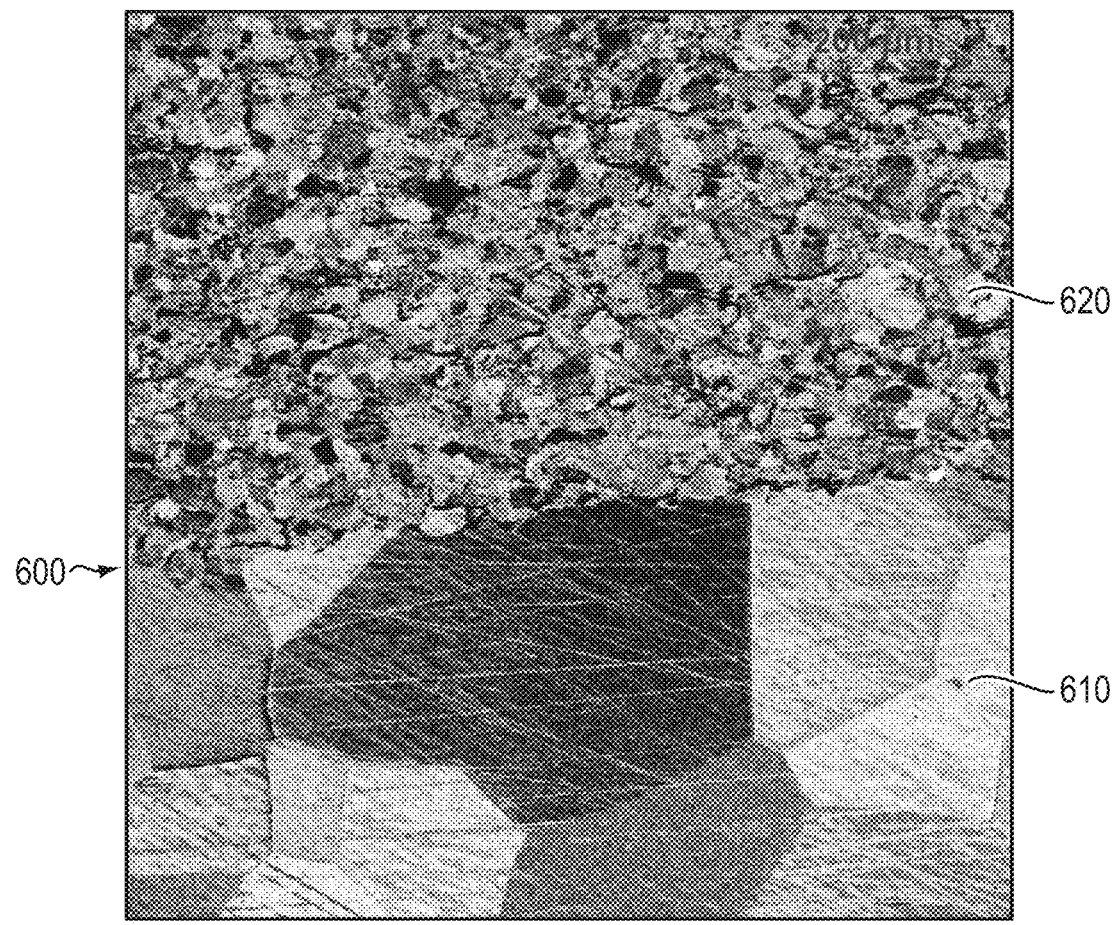

In many embodiments, the interface between the eroded surface of the target and the spray-deposited material is detectable visually and/or by metallographic evaluation, i.e., all or a portion of the interface may include a distinct boundary line between the eroded surface of the target and the spray-deposited material. For example, the spray-deposited material may exhibit improved metallurgical character (finer grain size and a finer degree of chemical homogeneity) than the original target material. Furthermore, the interface may be detectable via chemical analysis, as it may incorporate a finite concentration of impurities (e.g., oxygen and/or carbon) that is detectable (i.e., greater than a background level of the target) but that preferably has no deleterious impact on the sputtering process in which the partially refurbished target is employed. FIG. 5 depicts an exemplary boundary line 500 at an interface, within a partially refurbished MoTi sputtering target, between an uneroded region 510 initially fabricated via powder metallurgy techniques (e.g., hot or cold isostatic pressing) and a spray-deposited region 520 deposited by cold spray. FIG. 6 is a micrograph depicting a similar boundary line 600 between an uneroded region 610 having a larger grain size than that within a spray-deposited region 620 deposited by cold spray. In some embodiments, the grain size of region 620 may be increased via post-spray annealing such that the grain size of region 620 approaches, or even becomes approximately equal to, that of region 610. Region 610 may be initially fabricated by, for example, ingot metallurgy (e.g., pressing and/or rolling) or powder metallurgy techniques (e.g., pressing and sintering, or hot or cold isostatic pressing).

In preferred embodiments, the spray refurbishment of deep pockets 210 is performed such that the obliquity angle between the jet of sprayed particles and the surface contour of the deep pockets 210 is approximately 45° or greater (e.g., between approximately 45° and approximately 90°), as described in U.S. Patent Application Publication No. 2013/0156967, filed Dec. 13, 2012, the entire disclosure of which is incorporated by reference herein. In embodiments in which the sprayed material 410 is a mixture of two or more different materials (e.g., Mo and Ti), such large obliquity angles may enable high deposition efficiencies, thus enabling a controlled, consistent composition of the sprayed material 410 (since, for example, different deposition efficiencies of the different materials results in variations in composition). Such large obliquity angles also provide, in preferred embodiments, low porosity of sprayed material 410 and high bond strength between sprayed material 410 and the sputtering target.

After spray-deposition of the material 410 to form the partially refurbished target 400, the target 400 (at least proximate the material 410) may be heat treated for stress relief, to improve ductility, toughness, and bonding (e.g., bond strength), to reduce interstitial gas content, and/or to provide the material 410 with a microstructure substantially equal to that of other portions of target 400 (i.e., the unconsumed and thus unsprayed regions thereof). In some embodiments of the invention, the heat treatment may be performed under vacuum, at a temperature between approximately 700° C. and approximately 1050° C., and/or for a time between approximately 1 hour and approximately 16 hours. Instead of or in addition to such heat treatments, the partially refurbished target 400 (at least proximate the material 410) may be machined, ground, and/or polished before replaced in a sputtering tool for additional sputtering therewith. For example, if the material 410 extends above the surrounding material of the target 400 after spraying, it may be ground or machined such that its top surface is substantially coplanar with at least some of the surrounding surface contour of the target 400. Such machining, grinding, and/or polishing may, e.g., help minimize or eliminate arcing from the sputtering target during sputtering processes and/or reduce burn-in time (should it be required).

In addition, the heat treatment may relieve residual stresses from the spray-deposition process. For example, in many cases, sprayed material melted during spraying tends to have tensile residual stress, while sprayed material that is not melted during spraying tends to have compressive residual stress. (For example, cold-sprayed Ta may have residual compressive stress of between 30 and 50,000 psi.) Such residual stresses may result in non-uniform sputtering rates from the target incorporating the sprayed material. In conventional (i.e., not incorporating sprayed material) targets, residual machining stresses frequently necessitate a costly burn-in period (i.e., sputtering away of the stressed surface layer) prior to sputtering with new targets. Embodiments of the present invention described herein facilitate the partial spray refurbishment of sputtering targets and subsequent heat treatment. In this manner, the need for a burn-in period prior to sputtering from the partially refurbished target is reduced or substantially eliminated.

Example

The amount of erosion for a spent MoTi P8 sputtering target was measured after the target had been sputtered within a sputtering tool. The new target weight was approximately 65 kg, and the weight of the eroded target was approximately 46.2 kg. Thus, approximately 29% of the target had been sputtered away, and complete refurbishment of the target would have utilized at least 19 kg of powder (i.e., particulates of the sputtering material). Moreover, full refurbishment of the target may have involved overspray (i.e., spray deposition to levels above the initial surface plane of the target) and/or machining losses, thus necessitating the use of at least 24 kg of powder. Utilizing typical spray rates of 3 kg/hour, full refurbishment of the target would have required at least 8 hours of spray time.

Surface profiling of the spent target revealed that the typical erosion depth of the medium-depth regions was approximately 6 mm, but the depth of the deep pockets near the ends of the target the depth was approximately 12 mm. The volume of material required to fill each of the deep pockets to approximately the same level as the medium-depth regions was only about 28 cm3, corresponding to approximately 0.2 kg of the MoTi material of the target. Thus, only approximately 0.4 kg of spray material was required to fill the two deep pockets of the eroded sputtering target. Thus, the partial refurbishment of the target required less than 2% of the powder that would have been required for full refurbishment, and the partial refurbishment enabled further sputtering of the partially refurbished target. The partial refurbishment of the target took only approximately 10-20 minutes, rather than the 8 hours required for full refurbishment. The target was reinserted into the sputtering tool, and additional sputtering processes were performed utilizing the partially refurbished target. The sputtering rate of the partially refurbished target, as well as the physical and electrical properties of the sputtered material, was substantially identical to those achieved via sputtering before the partial refurbishment.

In this example, the P8 sputtering target was approximately 2700 mm long and approximately 200 mm wide and possessed a racetrack erosion pattern of comparable dimensions. As mentioned above, full refurbishment of such a large area typically requires complicated spray-deposition apparatus with large robotics to extend across the entire area. However, the deep pockets were only about 50 mm long and had a fairly shallow slope to the shallow-depth regions that was only an additional 150 mm long. Thus, the spray-deposition system (and related robotics) needed only to extend about 200 mm for partial refurbishment. This enabled the utilization of turn-key laboratory-size gantry-based cold-spray systems such as the VRC Gen III Hybrid High Pressure Cold Spray System available from VRC Metal Systems of Rapid City, S. Dak. Such units cost less than about 25% the cost of a full-size cold-spray system required for full refurbishment of such large sputtering targets.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A partially refurbished sputtering target comprising:
   a target plate (i) comprising a target material and (ii) having a surface contour defining (a) a top surface and (b) a recessed region having a surface recessed below the top surface; and
   disposed on the target plate adjacent but not within the recessed region, a layer of unmelted metal powder (i) having a top surface (a) approximately coplanar with the top surface of the target plate or (b) recessed below the top surface to a depth no deeper than a depth of the surface of the recessed region, and (ii) having an interface with the plate disposed at a depth deeper than the surface of the recessed region.

2. The partially refurbished sputtering target of claim 1, wherein the top surface of the layer of unmelted metal powder is approximately coplanar with the top surface of the target plate.

3. The partially refurbished sputtering target of claim 1, wherein the top surface of the layer of unmelted metal powder is recessed below the top surface to a depth shallower than the depth of the surface of the recessed region.

4. The partially refurbished sputtering target of claim 1, wherein the top surface of the layer of unmelted metal powder is recessed below the top surface to a depth substantially equal to ±10% the depth of the surface of the recessed region.

5. The partially refurbished sputtering target of claim 1, further comprising a sputtering tool in which the target plate is disposed.

6. The partially refurbished sputtering target of claim 1, wherein the layer of unmelted metal powder comprises the target material.

7. The partially refurbished sputtering target of claim 1, further comprising a backing plate affixed to the target plate.

8. The partially refurbished sputtering target of claim 7, wherein the backing plate comprises a material having a melting point lower than a melting point of the target material.

9. The partially refurbished sputtering target of claim 7, wherein the backing plate comprises at least one of copper, aluminum, or steel.

10. The partially refurbished sputtering target of claim 7, wherein the target plate is affixed to the backing plate with a bonding agent.

11. The partially refurbished sputtering target of claim 10, wherein a melting point of the bonding agent is less than approximately 200° C.

12. The partially refurbished sputtering target of claim 10, wherein the bonding agent comprises indium solder.

13. The partially refurbished sputtering target of claim 1, wherein:
    the target plate has a first grain size and a first crystalline microstructure, and
    the layer of unmelted metal powder has at least one of (i) a second grain size finer than the first grain size, or (ii) a second crystalline microstructure more random than the first crystalline microstructure.

14. The partially refurbished sputtering target of claim 13, wherein the target plate was initially formed by ingot metallurgy or powder metallurgy.

15. The partially refurbished sputtering target of claim 13, further comprising a distinct boundary line between the target plate and the layer of unmelted powder.

16. The partially refurbished sputtering target of claim 1, wherein the target material comprises at least one of Mo, Ti, Mo/Ti, Nb, Ta, W, Zr, a mixture of two or more thereof or one or more thereof with one or more other metals, or an alloy of two or more thereof or one or more thereof with one or more other metals.

17. The partially refurbished sputtering target of claim 1, wherein the target material comprises at least one of Al, Cu, Ag, Au, Ni, a mixture of two or more thereof or one or more thereof with one or more other metals, or an alloy of two or more thereof or one or more thereof with one or more other metals.

18. The partially refurbished sputtering target of claim 1, wherein a volume of the layer of unmelted metal powder is less than a volume of the recessed region.

19. The partially refurbished sputtering target of claim 1, wherein:
    the target plate is rectangular and has first and second opposing ends;
    the recessed region and the layer of unmelted metal powder collectively define an annulus, the surface contour of at least a portion of a center of the annulus corresponding to the top surface of the target plate; and
    the layer of unmelted metal powder is disposed within (i) a first end portion of the annulus proximate the first end of the target plate and (ii) a second end portion of the annulus proximate the second end of the target plate.

* * * * *